(12) United States Patent
Anderson et al.

(10) Patent No.: US 7,393,703 B2
(45) Date of Patent: Jul. 1, 2008

(54) METHOD FOR REDUCING WITHIN CHIP DEVICE PARAMETER VARIATIONS

(75) Inventors: Brent Alan Anderson, Jericho, VT (US); Shahid Ahmad Butt, Ossining, NY (US); Allen H. Gabor, Katonah, NY (US); Patrick Edward Lindo, Poughkeepsie, NY (US); Edward Joseph Nowak, Essex Junction, VT (US); Jed Hickory Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 11/382,489

(22) Filed: May 10, 2006

(65) Prior Publication Data
US 2007/0264729 A1 Nov. 15, 2007

(51) Int. Cl.
*G01R 31/26* (2006.01)
*H01L 21/00* (2006.01)
(52) U.S. Cl. .......................................... 438/14; 438/11
(58) Field of Classification Search ................... 438/11, 438/14
See application file for complete search history.

(56) References Cited
U.S. PATENT DOCUMENTS

| | | | |
|---|---|---|---|
| 5,095,267 A | 3/1992 | Merrill et al. | |
| 5,486,786 A | 1/1996 | Lee | |
| 6,124,143 A | 9/2000 | Sugasawara | |
| 6,507,942 B1 | 1/2003 | Calderone et al. | |
| 6,893,883 B2 * | 5/2005 | Hui et al. ....................... | 438/14 |
| 6,939,727 B1 * | 9/2005 | Allen et al. .................... | 438/14 |
| 7,010,451 B2 * | 3/2006 | Dorough et al. ............. | 702/117 |
| 7,020,860 B1 * | 3/2006 | Zhao et al. ..................... | 716/5 |
| 7,256,055 B2 * | 8/2007 | Aghababazadeh et al. .... | 438/11 |
| 2004/0051562 A1 | 3/2004 | Gauthier et al. | |
| 2004/0061561 A1 | 4/2004 | Monzel et al. | |

* cited by examiner

*Primary Examiner*—Luan Thai
(74) *Attorney, Agent, or Firm*—Schmeiser, Olsen & watts; William D. Sabo

(57) ABSTRACT

A method of reducing parametric variation in an integrated circuit (IC) chip and an IC chip with reduced parametric variation. The method includes: on a first wafer having a first arrangement of chips, each IC chip divided into a second arrangement of regions, measuring a test device parameter of test devices distributed in different regions; and on a second wafer having the first arrangement of IC chips and the second arrangement of regions, adjusting a functional device parameter of identically designed field effect transistors within one or more regions of all IC chips of the second wafer based on a values of the test device parameter measured on test devices in regions of the IC chip of the first wafer by a non-uniform adjustment of physical or metallurgical polysilicon gate widths of the identically designed field effect transistors from region to region within each IC chip.

22 Claims, 12 Drawing Sheets

METHOD FOR REDUCING WITHIN CHIP DEVICE PARAMETER VARIATIONS

FIELD OF THE INVENTION

The present invention relates to the field of integrated circuit manufacture; more specifically, it relates to methods for reducing within chip device parameter variations and an integrated circuit with reduced within chip device parameter variations.

BACKGROUND OF THE INVENTION

Integrated circuit manufacturing processes do not always result in uniform device performance across the same chip. As devices are scaled ever smaller, these variations can adversely effect integrated circuit performance because devices fabricated in one region of the integrated circuit chip perform differently than identically designed devices fabricated an another region of the integrated circuit chip. Therefore, there is an ongoing need for methods to identify and then adjust the integrated circuit manufacturing processes to reduce within chip device parameter variations.

SUMMARY OF THE INVENTION

A first aspect of the present invention is a method, comprising: on a first wafer having a first arrangement of integrated circuit chips, each integrated circuit chip divided into a second arrangement of regions, measuring a same test device parameter of test devices distributed in different regions of the second arrangement of regions; and on a second wafer having the first arrangement of integrated circuit chips, each integrated circuit chip divided into the second arrangement of regions, adjusting a same functional device parameter of identically designed field effect transistors within one or more same regions of all integrated circuit chips of the second wafer based on a values of the same test device parameter measured on test devices in regions of the integrated circuit chip of the first wafer corresponding to the one or more same regions of the integrated circuit chips of the second wafer by a non-uniform adjustment of physical polysilicon gate widths of the identically designed field effect transistors from region to region within each integrated circuit chip.

A second aspect of the present invention is a method, comprising: on a first wafer having a first arrangement of integrated circuit chips, each integrated circuit chip divided into a second arrangement of regions, measuring a same test device parameter of test devices distributed in different regions of the second arrangement of regions; and on a second wafer having the first arrangement of integrated circuit chips, each integrated circuit chip divided into the second arrangement of regions, adjusting a same functional device parameter of identically designed field effect transistors within one or more same regions of all integrated circuit chips of the second wafer based on a values of the same test device parameter measured on test devices in regions of the integrated circuit chip of the first wafer corresponding to the one or more same regions of the integrated circuit chips of the second wafer by a non-uniform adjustment of physical source/drain ion implantation fabrication steps of the identically designed field effect transistors from region to region within each integrated circuit chip.

A third aspect of the present invention is An integrated circuit chip, comprising: a multiplicity of virtual regions, at least two or more of the virtual regions having identically designed field effect transistors; a reflectivity of light of a first region of the two or more virtual regions different from a reflectivity of light of a second region of the two or more virtual regions; first field effect transistors in the first region of the two or more virtual regions having physical polysilicon gate lengths that are different from physical polysilicon gate lengths of second field effect transistors in the second region of the two or more virtual regions, the first and second field effect transistors identically designed; and wherein a value of a functional device parameter of the first field effect transistors in the first region of the two or more virtual regions is the same as a value of a same functional device parameter of the second field effect transistors in the second region of the two or more virtual regions.

A fourth aspect of the present invention is An integrated circuit chip, comprising: a multiplicity of virtual regions, at least two or more of the virtual regions having identically designed field effect transistors; a reflectivity of light of a first region of the two or more virtual regions different from a reflectivity of light of a second region of the two or more virtual regions; first field effect transistors in the first of the two or more virtual regions having metallurgical polysilicon gate lengths that are different from metallurgical polysilicon gate lengths of second field effect transistors in the second region of the two or more virtual regions, the first and second field effect transistors identically designed; and wherein a value of a functional device parameter of the first field effect transistors in the first region of the two or more virtual regions is the same as a value of a same functional device parameter of the second field effect transistors in the second region of the two or more virtual regions.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Identically designed devices are defined as devices such as field effect transistors, diodes and resistors in which horizontal and vertical dimensions, doping profiles, materials and material thicknesses have been selected in the design stage of the fabrication cycle of an integrated circuit to be the same after fabrication of the device based on specified nominal parametric values of the device such as switching frequency, threshold voltage, physical and electrical channel lengths and widths, source and drain current flow, gate voltage, leakage current flow and other device parameters known in the art. However, during fabrication, identically designed field effect transistors may have different physical horizontal and vertical dimensions, doping profiles, and material thicknesses due to process variations.

Figure 1:
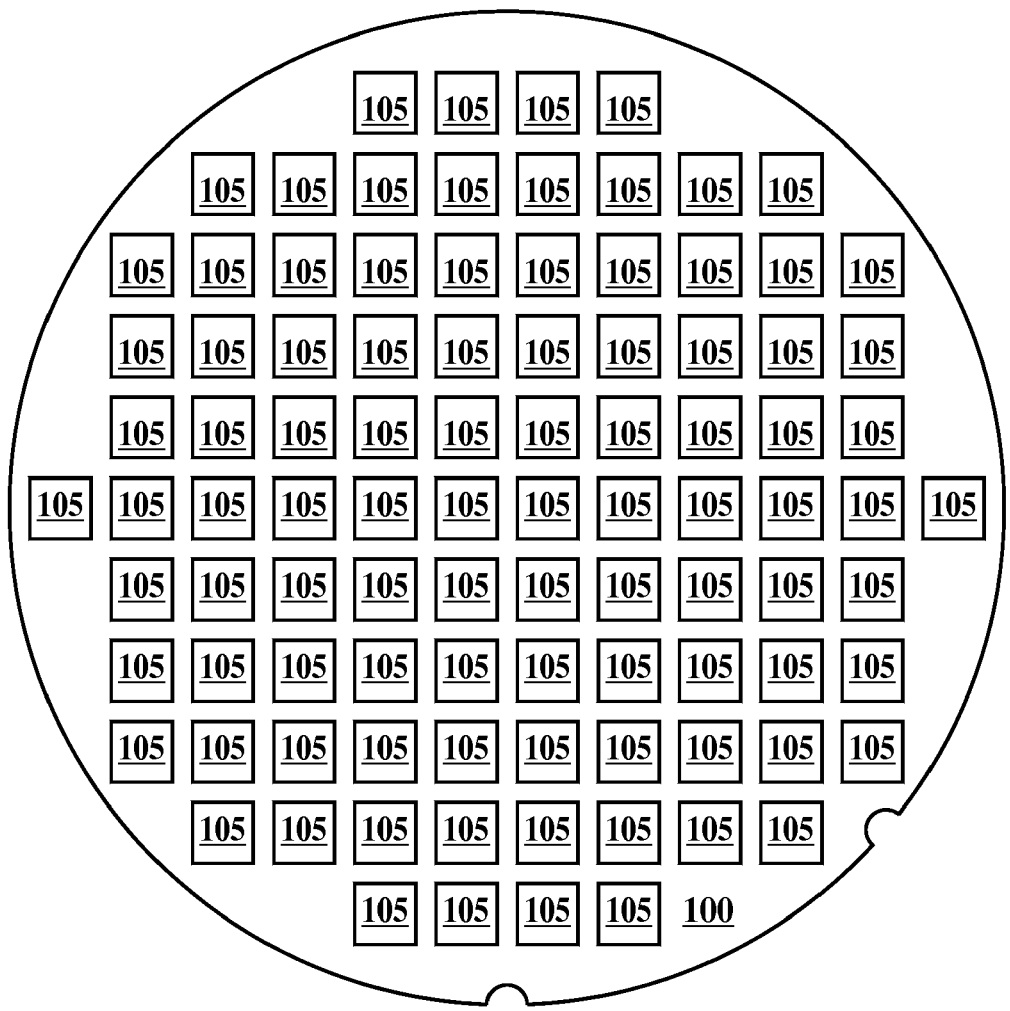
FIG. 1 is a plan view of a integrated circuit wafer.

FIG. 1 is a plan view of a integrated circuit wafer. In FIG. 1, an integrated circuit substrate 100 (commonly known as a wafer) includes an array of integrated circuit chips 105. Examples of substrates include, but are not limited to, bulk silicon substrates and silicon on insulator (SOI) substrates. Examples of integrated circuit chip types include, but are not limited to logic chips and memory chips. After fabrication and testing are complete, the substrate will be diced into individual integrated circuit chips.

Figure 2:
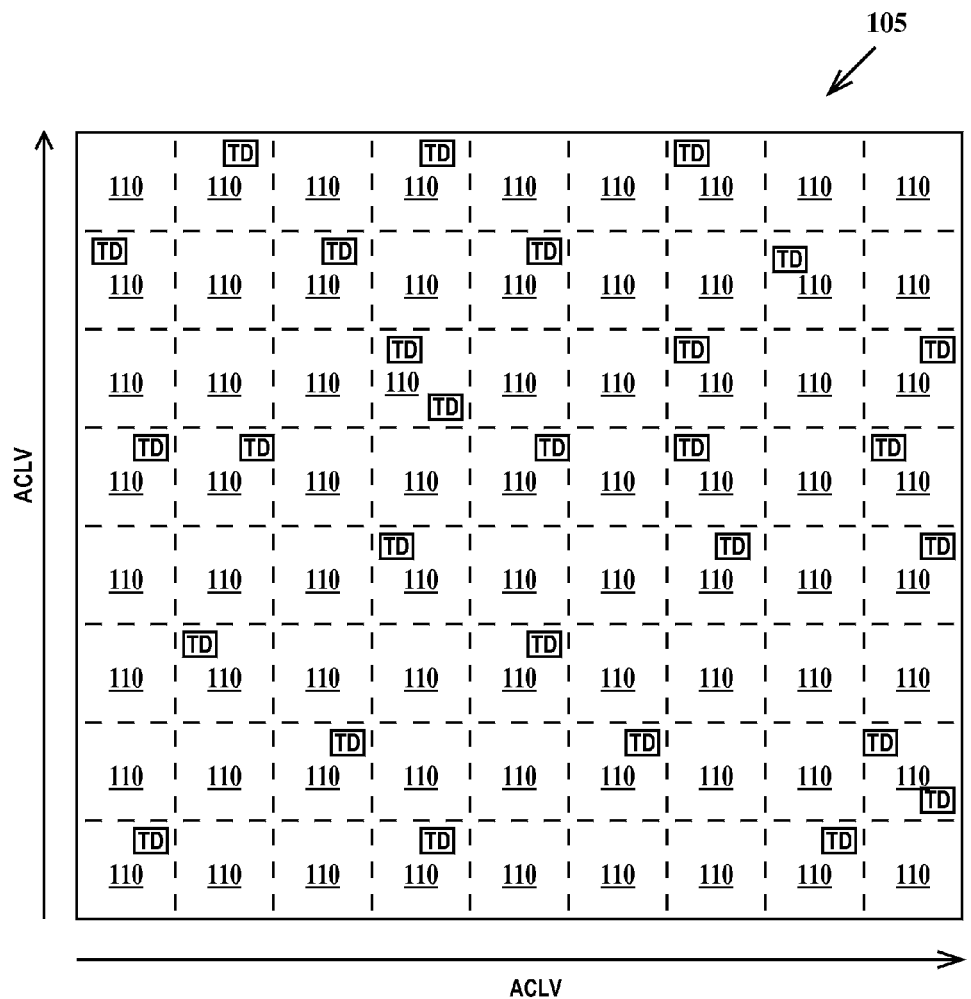
FIG. 2 is a plan view of an integrated circuit chip.

FIG. 2 is a plan view of an integrated circuit chip. In FIG. 2, each integrated circuit chip 105 is seen to be sub-divided into regions 110. Each region may contain none to multiple test devices (TD). Regions 110 are virtual regions not physical regions and allow two-dimensional topographical analysis of parametric data obtained by measuring the test devices during and/or after fabrication of integrated circuit chip 105.

Examples of test devices useful in the practice of the embodiments of the present invention, include, but are not limited to ring oscillators, field effect transistors (FETs) and polysilicon resistors. Ring oscillators (which in one form comprise an odd number of serially connected inverters) are advantageously useful for measurement of circuit performance (operating frequency or speed). FETs are advantageously useful for measurement of device performance such as switching frequency, threshold voltage ($V_T$) source-to-drain resistance ($R_{EXT}$), gate capacitance, drain current ($I_D$), gate voltage ($V_G$), effective channel length ($L_{EFF}$) and other performance related parameters. Poly resistors are advantageously useful (particularly for FETs that utilize polysilicon gates) for measurement of gate sheet resistance ($R_s$).

It should be understood that integrated circuit chips 105 are functional chips and the test devices are embedded in the functional chip.

Integrated circuit chips suffer from a phenomena called across-chip line-width variation (ACLV). Generally in ACLV, critical line-widths, such at the physical gate length (called $L_{POLY}$ with polysilicon gates) vary as function of pattern density across a chip as illustrated. The solution to ACLV for $L_{POLY}$ uniformity is to adjust the photolithographic exposure in a systematic or uniform manner across the chip to make all the gate lengths (of identically designed FETs) the same.

The inventors have discovered a new mechanism where the FET parameters of identically designed polysilicon gated FETs vary across an integrated circuit in a non-systematic or non-uniform manner. In particular, the $V_T$, $R_{EXT}$ (externally measured resistance between the source and drain) and polysilicon Rs of identically designed FETs have been found to vary in a non-systematic or non-uniform manner when ring oscillator measurements are performed. The inventors have shown that this non-systematic variation is induced during rapid thermal annealing (RTA) and appears to correlate with calculated reflectivity differences in different regions of the integrated circuit chip. One solution to this new mechanism is to adjust the fabrication process so that the $L_{POLY}$ of identically designed devices is not the same, the opposite of what is done for ACLV.

RTA annealing is a process whereby a wafer is exposed to light from high intensity lamps for a short period of time (for example 30 to 60 seconds) resulting in heating the substrate to between about 500° C. to about 800° C. to "activate" the dopant species. In an RTA process, the length L over which thermal equilibrium can be reached for a given time t, is approximately $L \sim (\sim \Box/c_v * t)^{1/2}$, where $\Box$ and $c_v$ are the thermal conductivity and specific heat of silicon, respectively. For 30 to 60 second RTA processes, L is greater than the longest dimension of the integrated circuit chip. However, when spike RTA processes (the RTA effective time near peak temperature is typically 1 second or less) are used, this is no longer true and L is significantly smaller then many very large scale integration (VLSI) chips.

Figure 3:
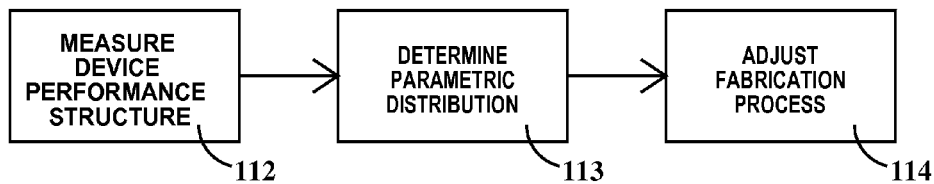
FIG. 3 is a flow diagram illustrating the major steps for reducing within chip device parameter variations according to embodiments of the present invention.

FIG. 3 is a flow diagram illustrating the major steps for reducing within chip device parameter variations according to embodiments of the present invention. In step 112, the TD devices of FIG. 2 are measured on a fabricated integrated circuit chip. In step 113, the distribution or variation by region 110 (see FIG. 2) is determined a device parameters such as $V_T$, $R_{EXT}$, Rs and $L_{POLY}$. In step 113, the fabrication process is adjusted (the physical polysilicon gate lengths, via lithographical changes or metallurgical gate lengths, see infra, via ion implantation changes) by one or more of the embodiments of the present invention described infra in order to have the device parameters of different identically designed FETs be as close to each other as possible, and the adjusted process is applied to subsequently processed wafers.

Before describing the embodiments of the present invention, it is helpful to describe the general fabrication of an FET. FIGS. 4A through 4D are cross-sectional views illustrating an exemplary fabrication process for fabricating integrated circuit devices.

Figure 4A:
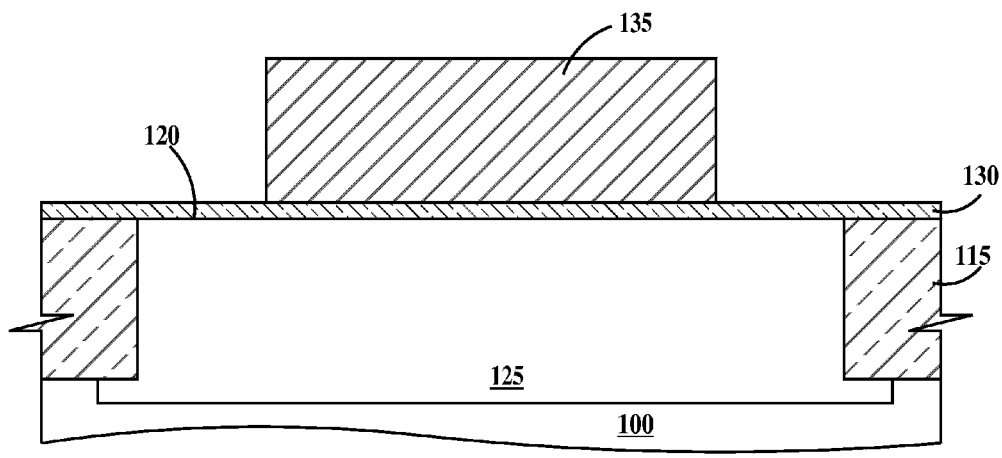
FIGS. 4A through 4D are cross-sectional views illustrating an exemplary fabrication process for fabricating integrated circuit devices.

In FIG. 4A trench isolation 115 is formed in substrate 100. Trench isolation extends from and is coplanar with a top surface of substrate 100 a fixed depth into substrate 100. A gate dielectric layer 130 is formed on top surface 120, and a polysilicon gate 135 is formed on top of gate dielectric layer 130. In one example, polysilicon gate 135 is formed by exposure of a photoresist layer applied to a deposited layer of doped or undoped polysilicon followed by exposure of the photoresist coating to actinic radiation through a gate photomask followed by developing of a pattern in the photoresist coating, etching, i.e. by reactive etch (RIE), wherever the polysilicon layer is not protected by the photoresist coating and then removing the patterned photoresist coating. In another example, a hardmask layer is deposited over the polysilicon layer and the photo-lithographic process is used to transfer the pattern to the hardmask and the hardmask pattern is then transferred to the polysilicon layer to form gate 135. Also formed between trench isolation 115 in substrate 100 is a well 125. Adjustment of this photolithography step forms the basis of the first, second and third embodiments of the present invention.

Figure 4B:
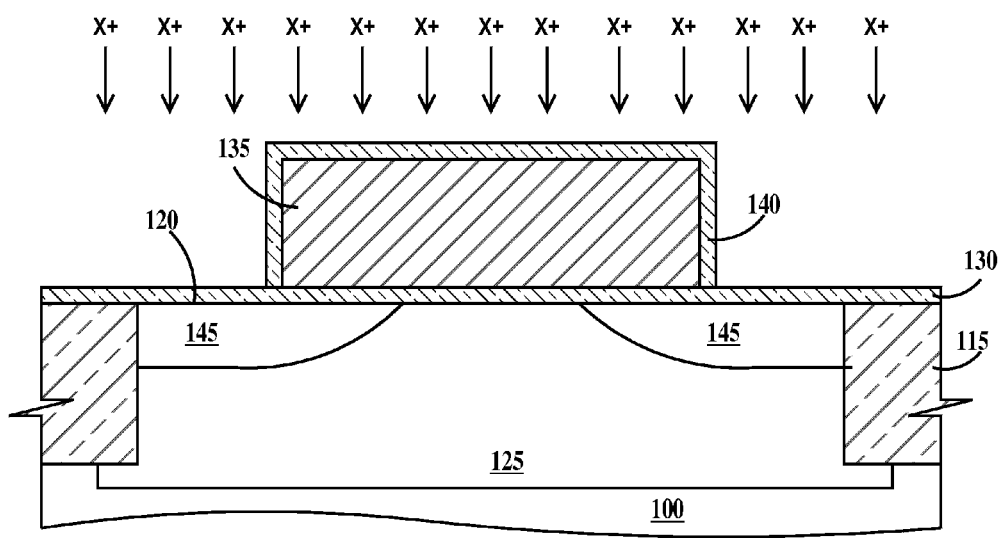

In FIG. 4B, a dielectric layer 140 (in one example, silicon dioxide) is formed over exposed surfaces of gate 135 and a source/drain extension ion implant of species X is performed to form source/drain extensions 145 in well 125.

Figure 4C:
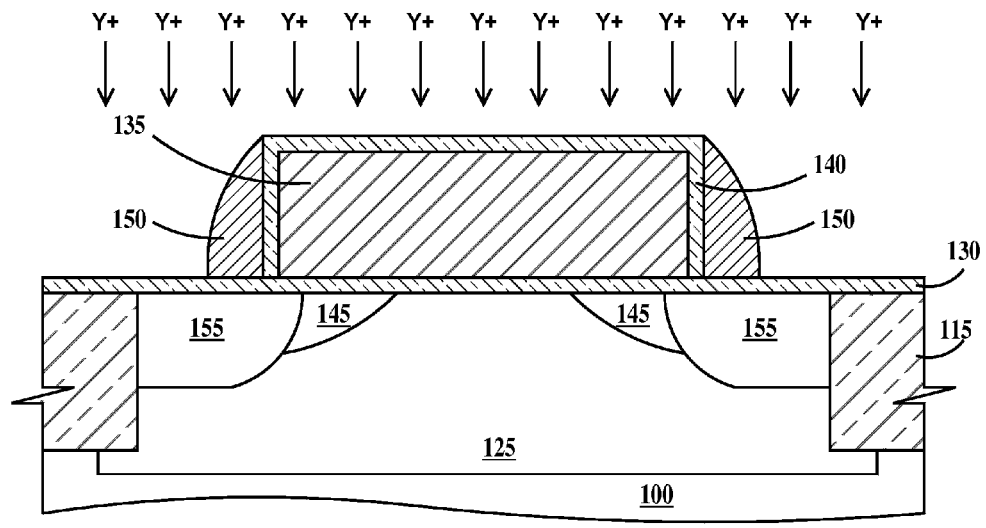

In FIG. 4C, a dielectric spacer 150 (in one example, silicon nitride) is formed over dielectric layer 140 on the sidewalls of gate 135 and a source/drain ion implant of species Y is performed to form source/drains 155 in well 125. In one example, spacers 150 are formed by depositing a conformal dielectric layer and then performing a RIE to remove the conformal layer from horizontal (horizontal surfaces are those surfaces parallel to the plane of the top surface of substrate 100) but substantially not from vertical surfaces.

Figure 4D:
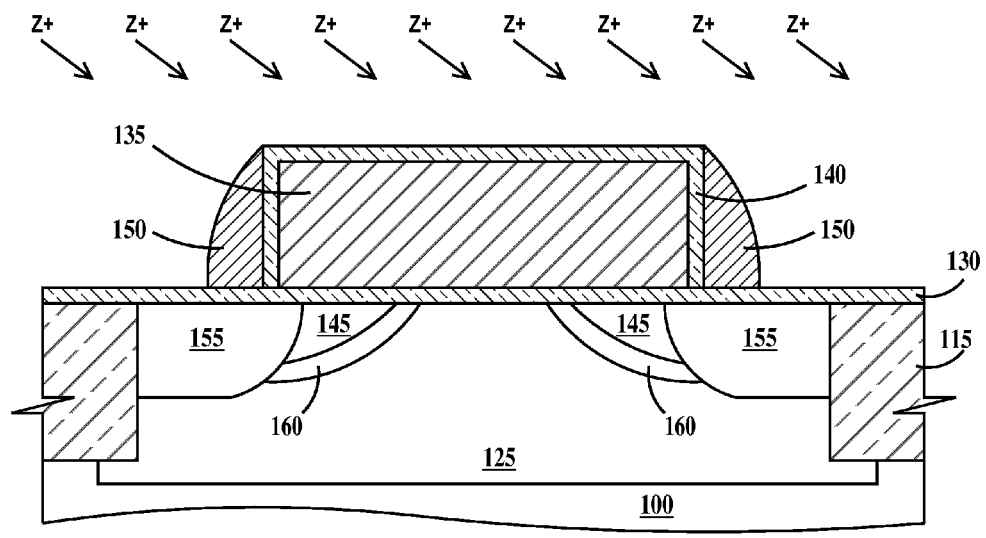

In FIG. 4D, a halo ion implant of species Z is performed to form halo well regions 160 in well 125. The halo ion implant is shown as an angled ion implant, but may be a vertical ion implant. It should be appreciated that more or less fabrication steps then those illustrated in FIGS. 4A through 4D and described supra may be employed in the fabrication FETs. For example, different combinations of sidewall spacers prior to the source/drain extension, source/drain, and halo well ion-implants may be used. For example, and the halo well and/or source/drain extension ion implants may not be used. Additionally, it should be understood that, the source/drain extension, source/drain, and halo well ion-implants are performed separately for n-channel FETs (NFETs) and p-channel FETs (PFETs) and photolithographic masking step are employed to prevent NFET ion-implants into PFETs and to prevent PFET ion-implants unto NFETs.

Adjustments to or additions to the extension and halo well ion-implants form the basis of a fourth embodiment of the present invention.

Figure 5A:
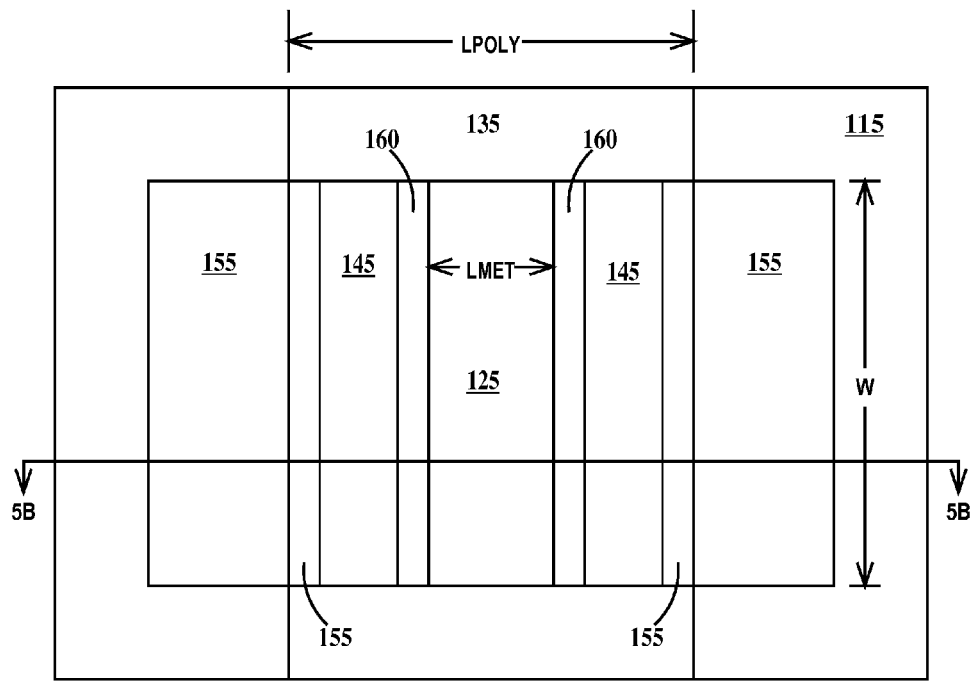
FIG. 5A plan view and FIG. 5B is a cross-sectional view through section line 5B-5A of FIG. 5A illustrating physical relationship of various structures of an integrated circuit device.
Figure 5B:
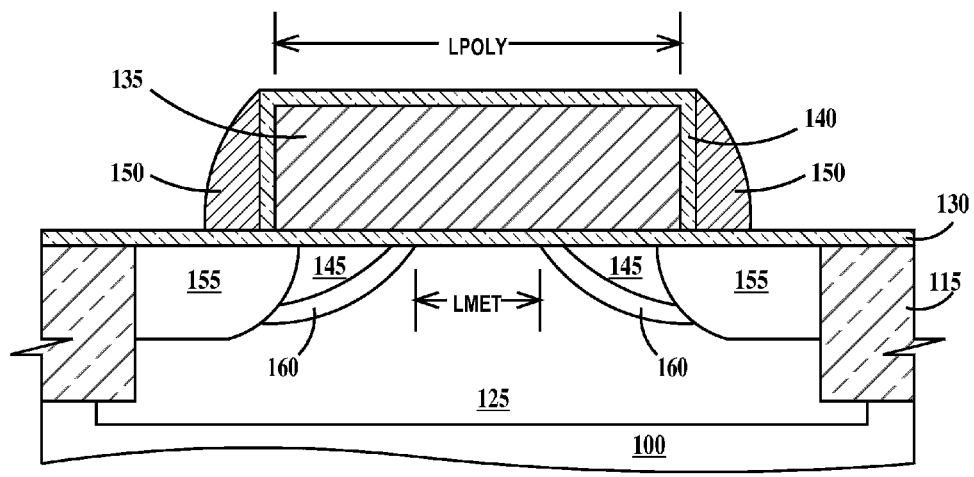

FIG. 5A plan view and FIG. 5B is a cross-sectional view through section line 5B-5A of FIG. 5A illustrating physical relationship of various structures of an integrated circuit device. In FIGS. 5A and 5B, it can be seen that $L_{POLY}$ is defined as the distance between the sidewalls over source/drains 155 of gate 135 while the metallurgical gate length ($L_{MET}$) is defined as the distance in the same direction as $L_{POLY}$, but between (1) halo wells 160 or (2) between source/drain extensions 145 if there are no halo wells 160 or (3) between source/drains 155 if there are neither halo wells 160 nor source/drain extensions 145. The gate width (W) is defined as the distance between trench isolation in a direction perpendicular to and in the same plane as $L_{POLY}$ and $L_{MET}$.

Figure 6A:
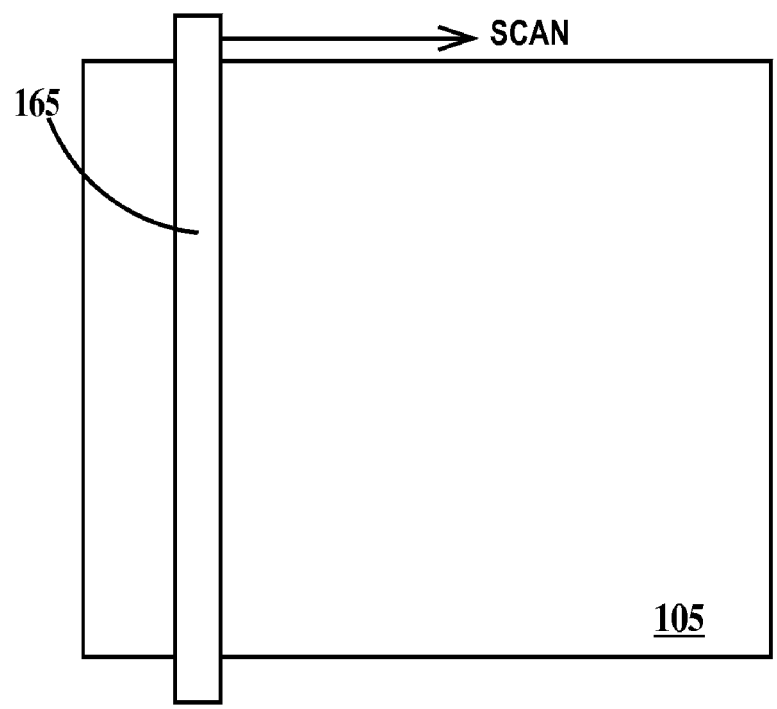
FIGS. 6A and 6B illustrate a method for reducing within chip device parameter variations according to a first embodiment of the present invention.
Figure 6B:
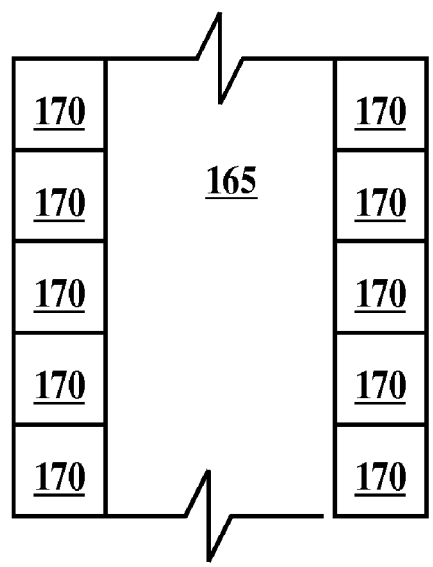

FIGS. 6A and 6B illustrate a method for reducing within chip device parameter variations according to the first embodiment of the present invention. In FIG. 6A, exposure of integrated circuit chip 105 to the gate photomask that defines the gate (see FIG. 4A) or $L_{POLY}$ (taking into account, the physical gate may end up slightly less in lengthy due to fabrication processes that consume some of the sidewalls of the gate as defined by the gate photomask) is performed through a moving slit 165. In FIG. 6B, it can be seen that the edges of slit 165 are fitted with trim tabs 170 that may each be independently opened and closed as the slit is scanned across integrated circuit chip 105. As slit 170 is scanned across integrated circuit chip 105, trim tabs 170 may be opened in closed as the slit passes through different regions 110 (see FIG. 2) of the integrated circuit chip to change the value of $L_{POLY}$. Additionally or alternatively, the actinic radiation intensity, pulse width and pulse frequency, slit width (in the direction of scan), slit speed or combinations thereof may be varied region to region. $L_{POLY}$ is thus, purposely made non-uniform by adjusting the exposure, based on test device measurements, across integrated circuit chip 105 in order to obtain a uniform FET parameter as described supra, for identically designed FETs. Exposure tools having the above capabilities include a unit called a program dose mapper or an equivalent unit.

Figure 7A:
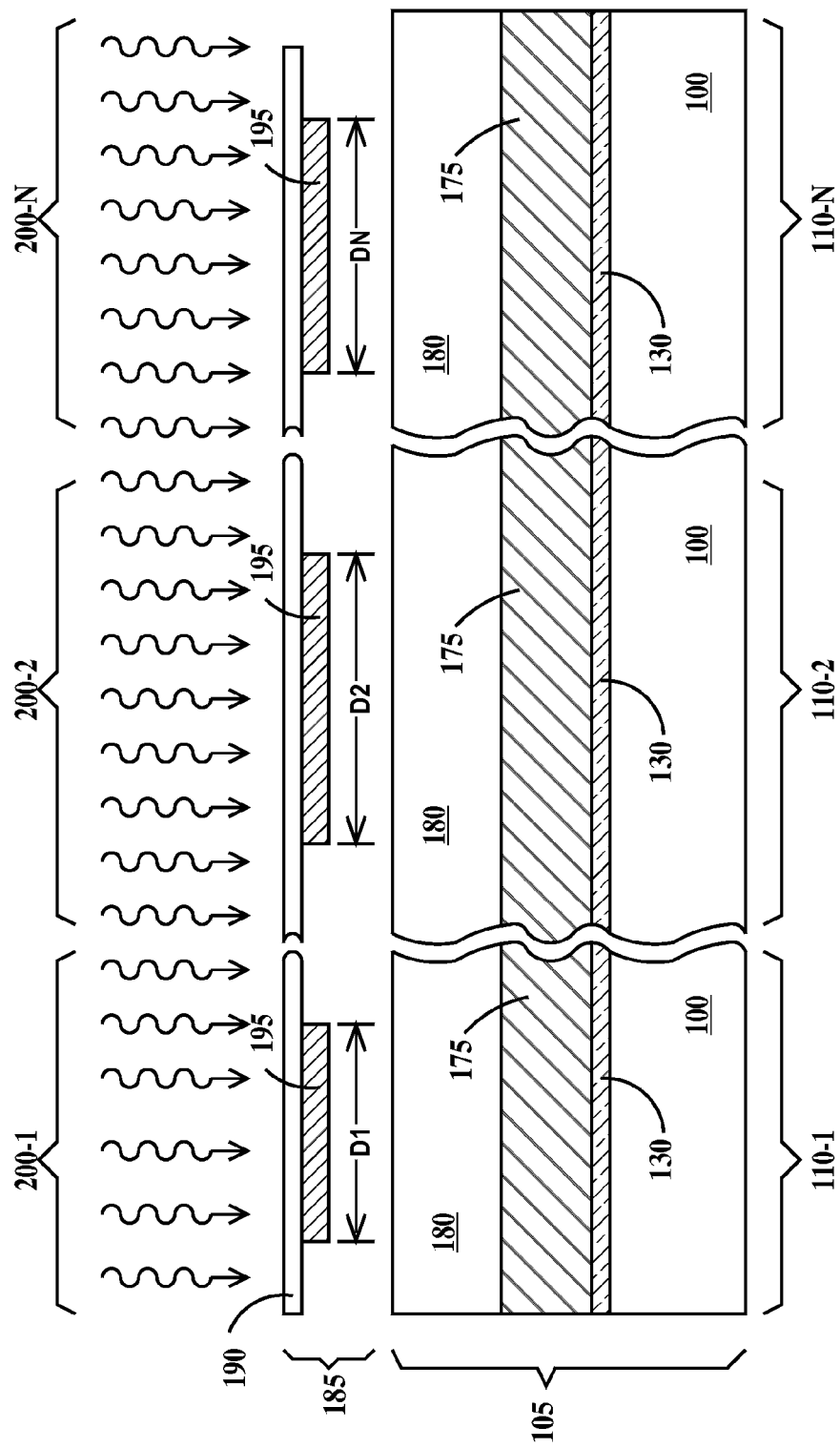
FIGS. 7A and 7B illustrate a method for reducing within chip device parameter variations according to a second embodiment of the present invention.
Figure 7B:
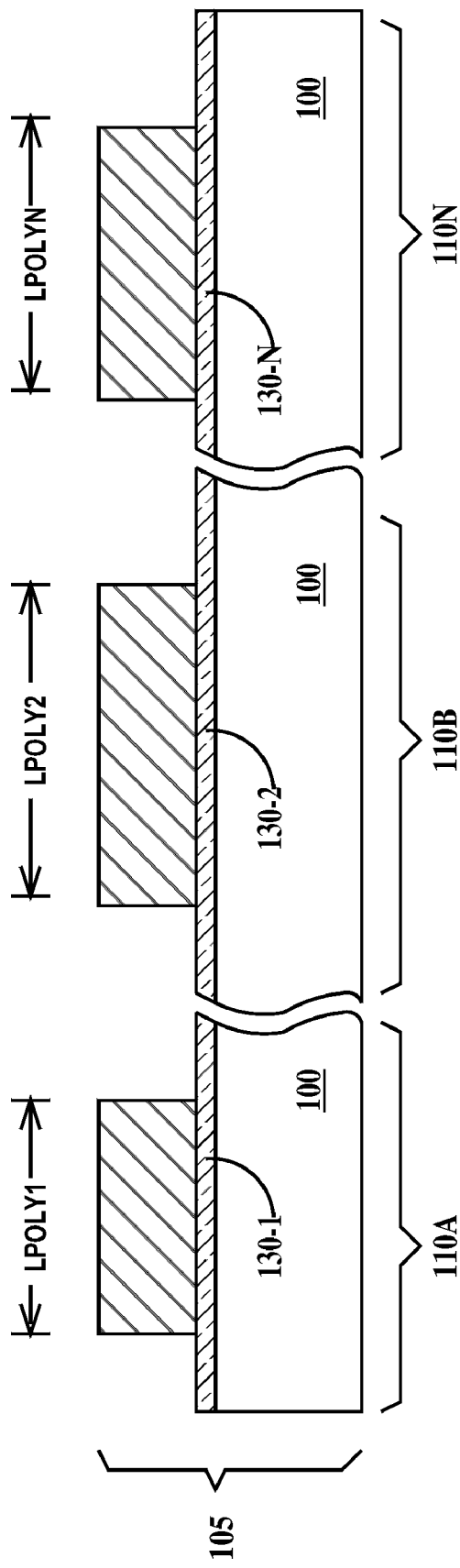

FIGS. 7A and 7B illustrate a method for reducing within chip device parameter variations according to the second embodiment of the present invention. In FIG. 7A integrated circuit chip 105 has a layer of polysilicon 175 deposited on gate dielectric layer 130. A photoresist layer 180 coats polysilicon layer 175. Integrated circuit chip 105 is divided into N regions 110-1, 110-2 through 110-N. A photomask 185 comprising a transparent substrate 190 having opaque shapes 195 (that define gate shapes) is similarly divided into corresponding regions 200-1, 200-2 through 200-N. Opaque shapes 195 have lengths D1, D2 through DN in corresponding region 200-1, 200-2 through 200-N. Lengths D1, D2 and D3 define corresponding gate widths $L_{POLY1}$, $L_{POLY2}$ through $L_{POLYN}$ (see FIG. 7B) in corresponding regions 110-1, 110-2 through 110-N of integrated circuit chip 105 after integrated circuit chip 105 is exposed to actinic radiation through gate photomask 185, developed, etched and photoresist 180 removed to yield the structure illustrated in FIG. 7B. The values D1, D2 through DN are chosen, based on test device measurements, to make $L_{POLY}$, purposely non-uniform across integrated circuit chip 105 in order to obtain a uniform FET parameter as described supra, for identically designed FETs. It should be noted, that the values of D1, D2 through DN need not all be different.

Figure 8A:
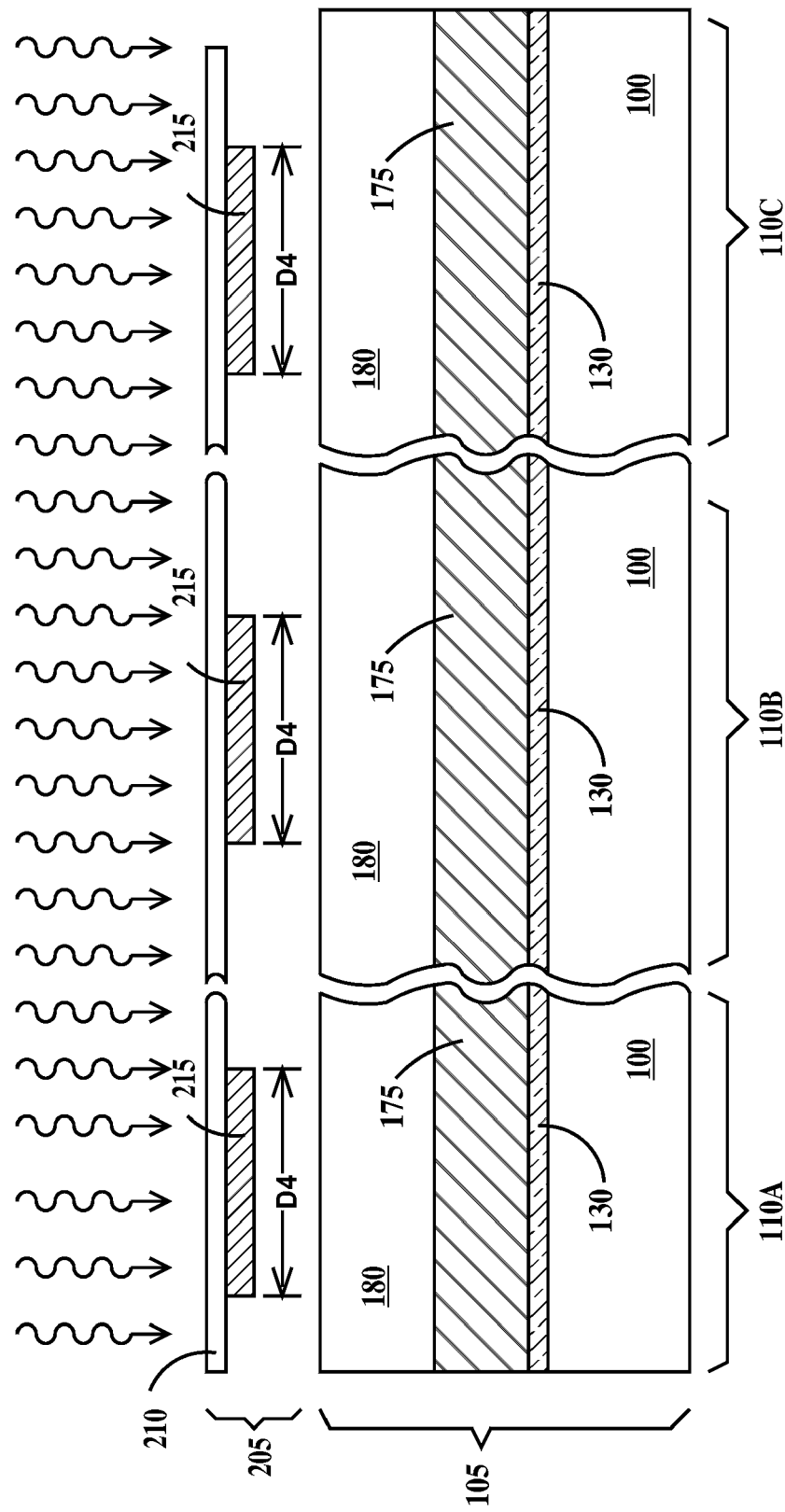
FIGS. 8A through 8C illustrate a method for reducing within chip device parameter variations according to a third embodiment of the present invention.
Figure 8B:
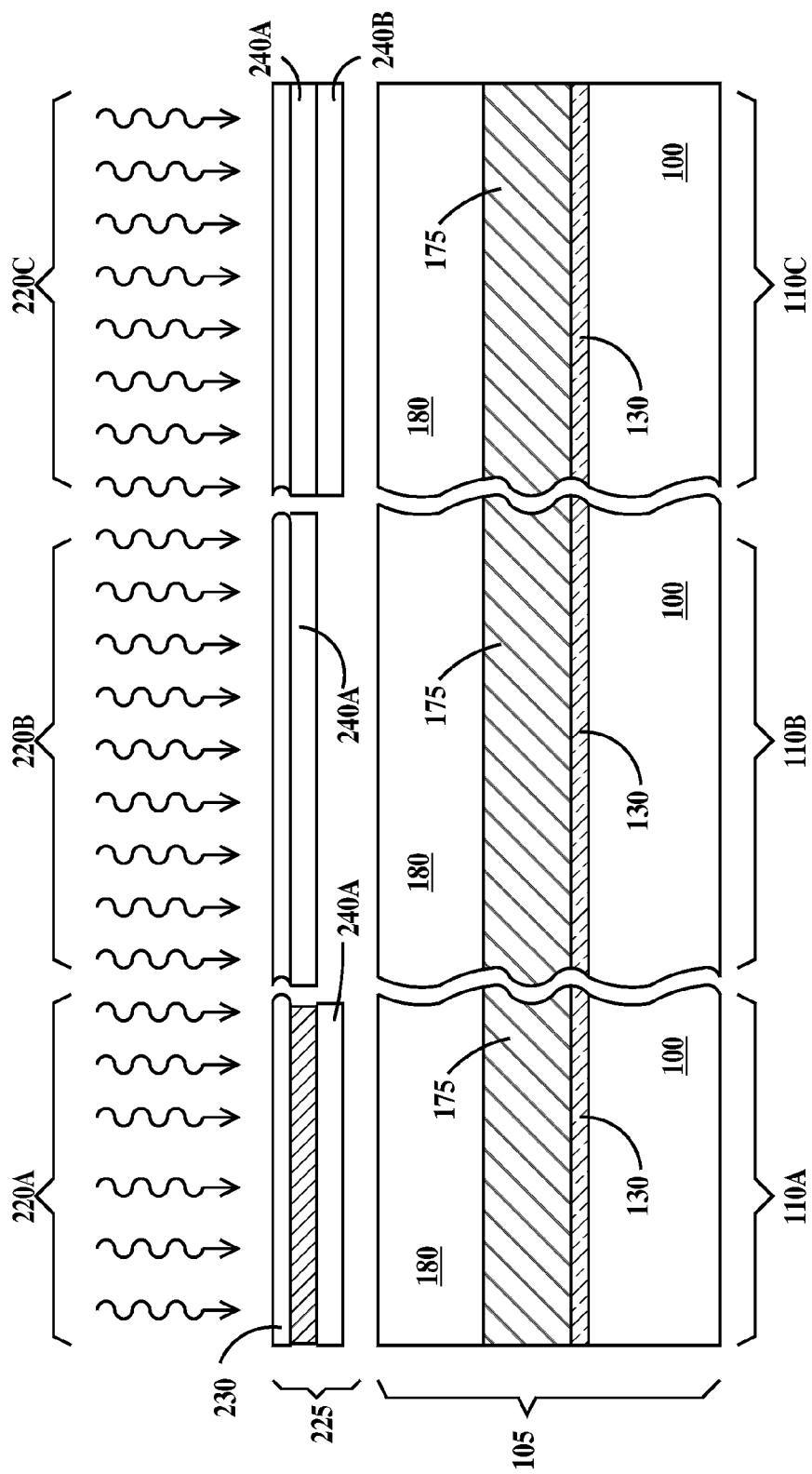

FIGS. 8A through 8B illustrate a method for reducing within chip device parameter variations according to the third embodiment of the present invention. FIG. 8A is similar to FIG. 7A except for a gate photomask 205 replacing gate photomask 185 of FIG. 7A and the renumbering of regions 110-1, 110-2 and 110-N to 110A, 110B and 110C respectively. In FIG. 8A gate photomask 205 comprises a transparent substrate 210 having opaque shapes 215 (that define the gates to be fabricated on integrated circuit chip 105) all of length D4. After exposure to actinic radiation photoresist layer 180 includes latent images (regions of exposed but not developed photoresist) corresponding to opaque shapes 215.

In FIG. 8B, a gate trim photomask 225 comprises a transparent substrate 230 having an opaque region 235A and clear regions 235B and 235C. Formed over opaque regions 235A and clear regions 235B and 235C is an actinic radiation attenuating coating 240A. Formed over coating 240A in clear region 235C is a second an actinic radiation attenuating coating 240B. The same photoresist layer that was exposed to actinic radiation in FIG. 8A is exposed to actinic radiation through gate trim photomask 225 in FIG. 8B. However regions 110A, 110B and 110C will receive different doses of actinic radiation. Region 110A will receive none, while region 110B will receive more than region 110C. Opaque regions are used where no adjustment of $L_{POLY}$ is required.

In one example, coatings 240A and 240B are neutral density layers with transmissions of less than about 10%. The amount of attenuation in each clear area of gate trim photomask is selected to result in a predetermined reduction in value of $L_{POLY}$ based on test device measurements, in different regions of integrated circuit chip 105 from the value of $L_{POLY}$ that would otherwise result if only gate photomask 205 was used.

Figure 8C:
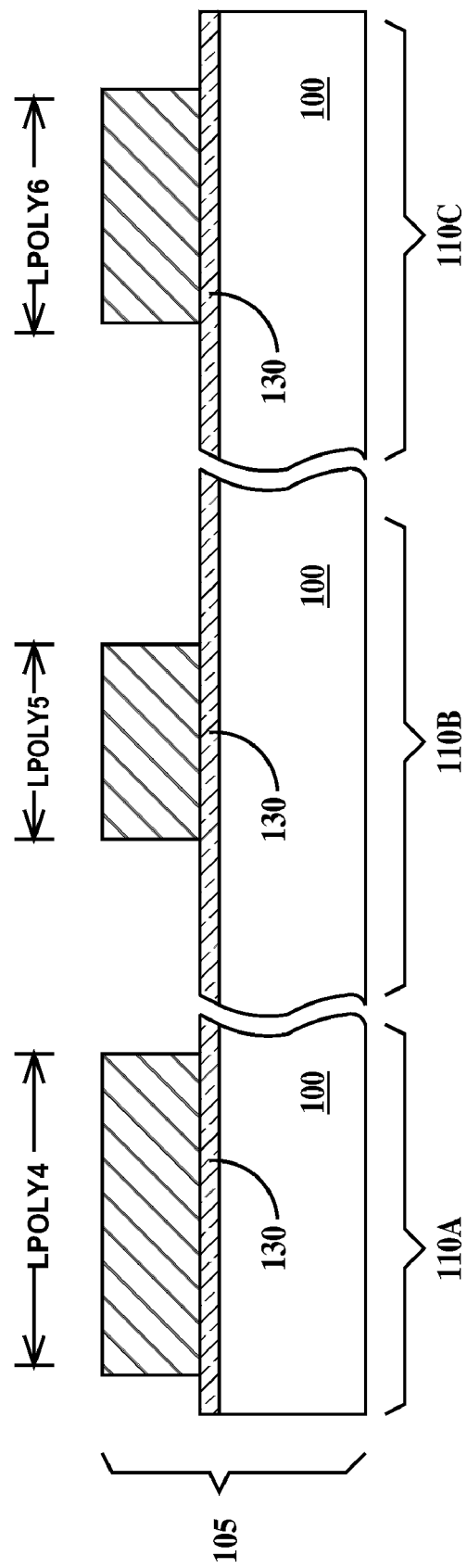

After integrated circuit chip 105 is exposed to actinic radiation through gate trim photomask 225, developed, etched and photoresist 180 removed the structure illustrated in FIG. 8C is generated. In FIG. 110A, gates in region 110A have a length $L_{POLY4}$, gates in region 110B have a length $L_{POLY5}$ and gates in region 110C have a length $L_{POLY6}$ where $L_{POLY4} > L_{POLY6} > L_{POLY5}$. Positive photoresist has been assumed in FIGS. 8A and 8B, so that the more light a latent image is exposed to the more de-polymerization occurs and the smaller the island of photoresist left after development (and thus the smaller the polysilicon gate lengths and widths). Since the there are two neutral density layers (240A and 240B) in region 110C, region 110C will be exposed to a lower dose of actinic radiation than region 11B and the latent image in region 110C will be effected less than the latent image in region 110B. Alternatively, instead of varying the number of neutral density coatings over different regions, different composition coatings with different actinic radiation attenuating capability may be formed over corresponding different region of the gate trim photomask.

Thus, $L_{POLY}$, has been made purposely non-uniform across integrated circuit chip 105 in order to obtain a uniform FET parameter as described supra, for identically designed FETs.

When a photolithographic photomask having more than one chip region is used to expose a wafer, the methods of the first three embodiments of the present invention are applied to each chip region identically.

Figures 9A, 9B:
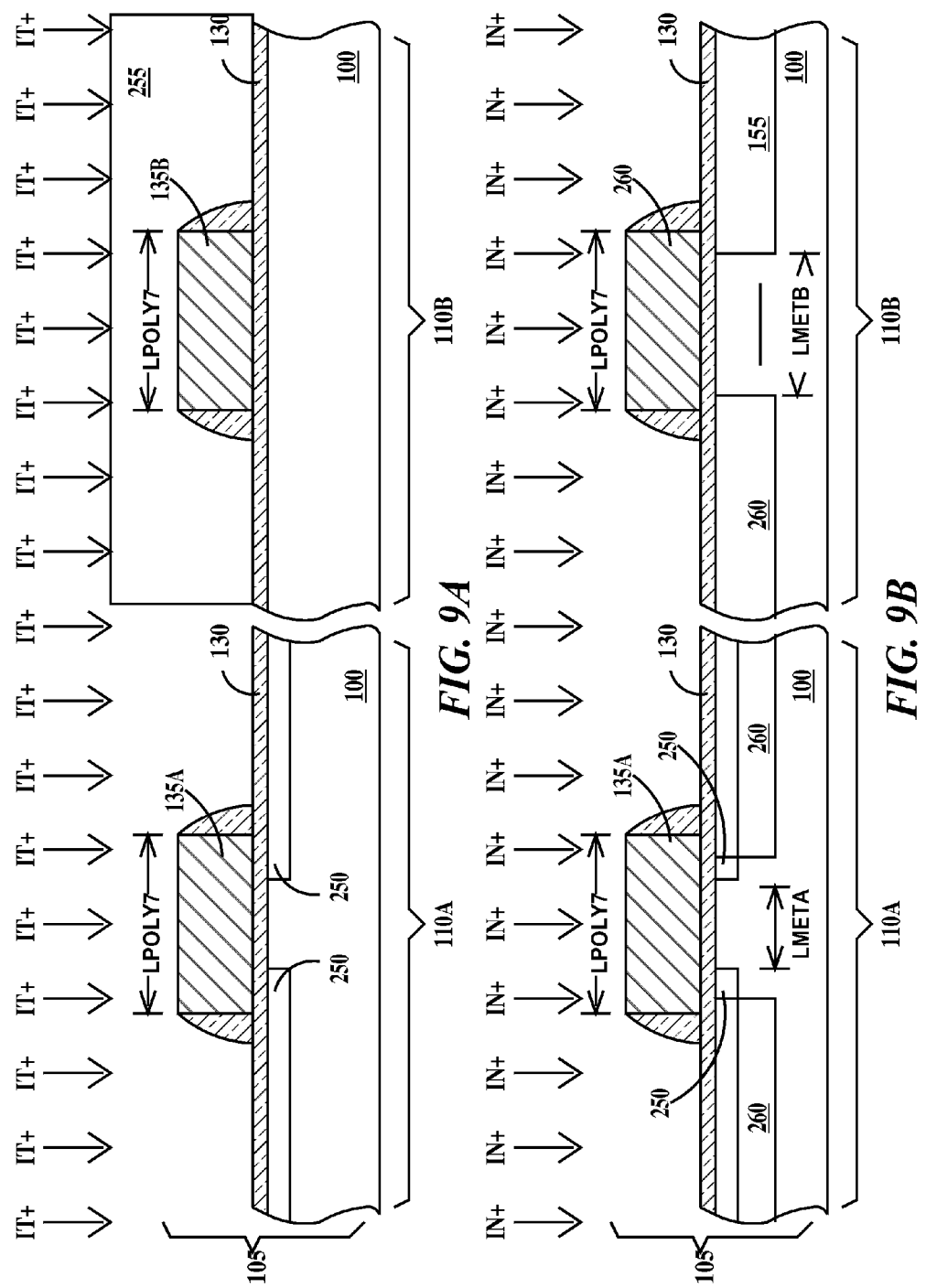
FIGS. 9A and 9B illustrate a method for reducing within chip device parameter variations according to a fourth embodiment of the present invention.

FIGS. 9A and 9B illustrate the method for reducing within chip device parameter variations according to a fourth embodiment of the present invention. In FIG. 9A, a first device in a region 110A of integrated circuit chip 110A, receives a trim ion-implantation of species $I_T$ to form source/drain trim regions 250 while a second device, identically designed to the first device, in region 110B does not because of mask layer 255 blocks the source/drain trim ion implantation. The physical gate lengths (LPOLY7) of gates 135A and 135N of devices in respective regions 110A and 110B are the same. In FIG. 9B, both regions 110A and 110B receive the same nominally designed ion implantations $I_N$, represented by a single ion-implantation, though there may be two or more nominally designed ion implantations. The net effect is that the value of the metallurgical gate length ($L_{META}$) of gate 135A in region 110A is greater than the value of he metallurgical gate length ($L_{METB}$) of gate 135B in region. While one source/drain trim ion implantation has been illustrated in FIGS. 9A and 9B, there may be multiple different source/drain trim ion implantations in corresponding different regions of the integrated circuit chip.

The source/drain trim ion implantation parameters of dose, energy and species are chosen, based on test device measurements, to make $L_{MET}$, purposely non-uniform across integrated circuit chip 105 in order to obtain a uniform FET parameter as described supra, for identically designed FETs.

Alternatively, rather than add whole new ion implantation steps, the source/drain extension ion implantations may be split into two or more different ion implantations, or the halo well ion implantations may be split into two or more different ion implantations in corresponding different regions based on test device measurements.

It should be recognized that to practice the fourth embodiment of the present invention on PFETs and NFETs, there would be a two source/drain ion implants, one of NFETs and one for PFETs as well as two sets of nominally designed ion implantations.

It should be recognized that all the embodiments of the present invention may be applied independently to identically designed PFETs and identically designed NFETs. It should also be recognized that the embodiments of the present invention may be applied to multiple identically designed FETs. In one example, the embodiments of the present invention may be applied independently to high threshold voltage, nominal threshold voltage and low threshold voltage FETs. A high threshold voltage FET is an FET having a designed threshold voltage higher than an otherwise identical nominal threshold voltage FET. A low threshold voltage FET is an FET having a designed threshold voltage lower than the otherwise identical nominal threshold voltage FET. In another example, the embodiments of the present invention may be applied independently to thick gate dielectric, nominal gate dielectric and thin gate dielectric FETs. A thick gate dielectric FET is an FET having a designed gate dielectric thicker than an otherwise identical nominal gate dielectric FET. A thin gate dielectric FET is an FET having a designed gate dielectric thinner than the otherwise identical nominal thickness gate dielectric FET.

Thus, the embodiments of the present invention provide methods for identifying and then adjusting the integrated circuit manufacturing processes to reduce within chip device parameter variations.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications, and changes as fall within the true spirit and scope of the invention.

What is claimed is:

1. A method, comprising:
    on a first wafer having a first arrangement of integrated circuit chips, each integrated circuit chip divided into a second arrangement of regions, measuring a same test device parameter of test devices distributed in different regions of said second arrangement of regions, one or more same regions of all integrated circuit chips of said first wafer including identically designed field effect transistors; and
    on a second wafer having said first arrangement of integrated circuit chips, each integrated circuit chip divided into said second arrangement of regions, adjusting a same functional device parameter of identically designed field effect transistors within one or more same regions of all integrated circuit chips of said second wafer based on values of said same test device parameter measured on test devices in regions of said integrated circuit chip of said first wafer corresponding to said one or more same regions of said integrated circuit chips of said second wafer by a non-uniform adjustment of physical polysilicon gate widths of said identically designed field effect transistors from region to region within each integrated circuit chip.

2. The method of claim 1, wherein said test devices are selected from the group consisting of ring oscillators, field effect transistors and polysilicon resistors.

3. The method of claim 1, wherein said same test device parameter is selected from the group consisting of switching frequency, threshold voltage, source-to-drain resistance, gate capacitance, drain current, gate voltage, effective channel length and sheet resistance.

4. The method of claim 1, wherein said functional device parameter is selected from the group consisting of threshold voltage, source-to-drain resistance and gate polysilicon sheet resistance.

5. The method of claim 1, further including:
    at a photolithographic fabrication step defining said physical polysilicon gate lengths of said identically designed field effect transistors, adjusting an actinic radiation exposure dose and exposing a photoresist layer formed on said second wafer for each region of each integrated circuit chip of said second wafer to said adjusted dose of actinic radiation.

6. The method of claim 5, wherein said adjusting said actinic radiation dose includes selectively opening and closing trim tabs of an exposure slit of a photolithographic exposure tool as said exposure slit is scanned over different regions of each of said integrated circuit chips.

7. The method of claim 6, wherein said adjusting said actinic radiation dose further includes adjusting actinic radiation intensity, actinic radiation pulse width, actinic radiation pulse frequency, slit width, slit scan speed or combinations thereof as said exposure slit is scanned over different regions of each of said integrated circuit chips.

8. The method of claim 5, wherein said adjusting said actinic radiation dose includes adjusting actinic radiation intensity, actinic radiation pulse width, actinic radiation pulse frequency, slit width, slit scan speed or combinations thereof as an exposure slit of a photolithographic exposure tool is scanned over different regions of each of said integrated circuit chips.

9. The method of claim 1, further including:
at a fabrication step defining said physical polysilicon gate lengths of said identically designed field effect transistors, exposing a photoresist layer formed on said second wafer to actinic radiation through a patterned photomask having a chip region divided into said second arrangement of regions, a width of pattern features defining said polysilicon physical gate lengths in at least two of said regions of said chip region being different.

10. The method of claim 1, further including:
at a fabrication step defining said physical polysilicon gate lengths, exposing a photoresist layer formed on said second wafer to a first dose of actinic radiation through a first patterned photomask having a first chip region divided into said second arrangement of multiple regions, a width of pattern features defining polysilicon physical gate lengths of said identically designed field effect transistors being the same on all regions of said first chip region; and
exposing said photoresist layer to a second dose of actinic radiation through a second patterned photomask having a second chip region divided into said second arrangement of multiple regions, at least two of said regions of said second chip region attenuating said second dose of actinic radiation differently.

11. The method of claim 1, further including:
performing a source/drain ion implantation of said identically designed field effect transistors of said first and second wafers; and
after performing said source/drain ion implantation, performing a rapid thermal anneal of said first and second wafers.

12. A method, comprising:
on a first wafer having a first arrangement of integrated circuit chips, each integrated circuit chip divided into a second arrangement of regions, measuring a same test device parameter of test devices distributed in different regions of said second arrangement of regions, one or more same regions of all integrated circuit chips of said first wafer including identically designed field effect transistors; and
on a second wafer having said first arrangement of integrated circuit chips, each integrated circuit chip divided into said second arrangement of regions, adjusting a same functional device parameter of identically designed field effect transistors within one or more same regions of all integrated circuit chips of said second wafer based on values of said same test device parameter measured on test devices in regions of said integrated circuit chip of said first wafer corresponding to said one or more same regions of said integrated circuit chips of said second wafer by a non-uniform adjustment of physical source/drain ion implantation fabrication steps of said identically designed field effect transistors from region to region within each integrated circuit chip.

13. The method of claim 12, wherein said test devices are selected from the group consisting of ring oscillators, field effect transistors and polysilicon resistors.

14. The method of claim 12, wherein said same test device parameter is selected from the group consisting of switching frequency, threshold voltage, source-to-drain resistance, gate capacitance, drain current, gate voltage, effective channel length and sheet resistance.

15. The method of claim 12, wherein said functional device parameter is selected from the group consisting of threshold voltage, source-to-drain resistance and gate polysilicon sheet resistance.

16. The method of claim 12, further including:
performing a same source/drain ion implantation of said identically designed field effect transistor in all regions of all said integrated circuit chips of said first and second wafers; and
performing a source/drain trim ion-implantation of said identically designed field effect transistors in each integrated circuit chip of said second wafer, either (i) an ion implantation dose, (ii) an ion implantation energy, or (iii) both said ion implantation dose and energy being different in at least two regions of each integrated circuit chip.

17. The method of claim 16, further including:
performing a same source/drain extension ion implantation of said identically designed field effect transistor in all regions of all said integrated circuit chips of said first and second wafers.

18. The method of claim 17, further including:
performing a same halo well ion implantation of said identically designed field effect transistor in all regions of all said integrated circuit chips of said first and second wafers.

19. The method of claim 12, further including:
performing a same source/drain ion implantation of said identically designed field effect transistor in all regions of each integrated circuit chip; and
performing a source/drain trim ion-implantation of each integrated circuit chip of said second wafer, said identically designed field effect transistors in at least one region of each integrated circuit chip receiving said source/drain trim ion implantation and corresponding said identically designed field effect transistors in at least one other region of each integrated circuit chip not receiving said source/drain trim ion implantation.

20. The method of claim 19, further including:
performing a same source/drain extension ion implantation of said identically designed field effect transistor in all regions of all said integrated circuit chips.

21. The method of claim 20, further including:
performing a same halo well ion implantation of said identically designed field effect transistor in all regions of all said integrated circuit chips.

22. The method of claim 12, further including:
performing a source/drain ion implantation of said identically designed field effect transistors of said first and second wafers; and
after performing said source/drain ion implantation, performing a rapid thermal anneal of said first and second wafers.

* * * * *